United States Patent
Ohishi et al.

(10) Patent No.: US 11,831,193 B2
(45) Date of Patent: Nov. 28, 2023

(54) POWER SUPPLY SYSTEM

(71) Applicant: HONDA MOTOR CO., LTD., Tokyo (JP)

(72) Inventors: Arata Ohishi, Saitama (JP); Hirokazu Oguma, Saitama (JP); Yasuo Yamada, Saitama (JP); Minoru Nagasawa, Saitama (JP); Yoshihiro Kanamaru, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 94 days.

(21) Appl. No.: 17/678,024

(22) Filed: Feb. 23, 2022

(65) Prior Publication Data

US 2022/0302737 A1    Sep. 22, 2022

(30) Foreign Application Priority Data

Mar. 19, 2021   (JP) .................................. 2021-046313

(51) Int. Cl.
*H02J 7/00* (2006.01)
*B60L 53/20* (2019.01)
*B60L 58/18* (2019.01)
*G01R 31/3835* (2019.01)

(52) U.S. Cl.
CPC ........ *H02J 7/007182* (2020.01); *B60L 53/20* (2019.02); *B60L 58/18* (2019.02); *G01R 31/3835* (2019.01); *H02J 7/0013* (2013.01); *H02J 7/0031* (2013.01); *B60L 2240/547* (2013.01); *H02J 2207/20* (2020.01)

(58) Field of Classification Search
CPC .... H02J 7/007182; B60L 53/20; B60L 58/18; B60L 58/20
USPC .................................. 307/9.1, 10.7
See application file for complete search history.

(56) References Cited

U.S. PATENT DOCUMENTS 11,489,329 B2 * 11/2022 Oiwa ....................... H02H 7/12

FOREIGN PATENT DOCUMENTS

JP           2017169311 A       9/2017

* cited by examiner

*Primary Examiner* — Daniel Kessie
*Assistant Examiner* — Dru M Parries
(74) *Attorney, Agent, or Firm* — CKC & Partners Co., LLC

(57) ABSTRACT

A power supply system includes: a first power circuit having a first battery and a first power line; a second power circuit having a second battery and a second power line; a voltage converter; a power converter; a first voltage acquisition unit which acquires a first closed circuit voltage lower limit CCVmin1 of the first battery; a second voltage acquisition unit which acquires a second closed circuit voltage lower limit CCVmin2 of the second battery; and a power control unit which operates the second power circuit based on a requested power, in which the power control unit isolates the second battery from the second power lines, in a case of a voltage difference between the first closed circuit voltage lower limit CCVmin1 and the second closed circuit voltage lower limit CCVmin2 becoming less than a first voltage threshold value A while output limitation of the second battery is being requested.

8 Claims, 9 Drawing Sheets

POWER SUPPLY SYSTEM

This application is based on and claims the benefit of priority from Japanese Patent Application No. 2021-046313, filed on 19 Mar. 2021, the content of which is incorporated herein by reference.

BACKGROUND OF THE INVENTION

Field of the Invention

The present invention relates to a power supply system. In more detail, it relates to a power supply system for an electric vehicle including two electrical storage devices.

Related Art

In recent years, development has been active in electric vehicles such as electric transport equipment equipped with a drive motor as a power generation source, and hybrid vehicles equipped with a drive motor and internal combustion engine as power generation sources. In such electric vehicles, power supply devices such as an electrical storage device (battery, capacitor, etc.) and fuel cell for supplying electrical energy to the drive motor is also built in. In addition, in recent years, a vehicle equipped with a plurality of power supply devices having different characteristics in an electric vehicle has also been developed.

Cited Document 1 shows a power supply system for an electric vehicle including a power circuit which connects a drive unit configured from a drive motor, inverter, etc. with a first electrical storage device; a second electrical storage device connected with this power circuit via a voltage converter; and a control device which performs switching control of this voltage converter. The control device sets a target current for the passing current, which is electrical current passing through the voltage converter according to a request from the driver, and performs the switching control of the voltage converter so that the passing current becomes the target current, combines the power outputted from the first electrical storage device and the power outputted from the second electrical storage device, and then supplies this to the drive motor.

Patent Document 1: Japanese Unexamined Patent Application, Publication No. 2017-169311

SUMMARY OF THE INVENTION

In the case of connecting two electrical storage devices by a voltage converter as in this power supply system, the power outputted from the second electrical storage device can basically be controlled by switching control of the voltage converter. However, when great power is requested by the drive motor as during acceleration, for example, the electrical current flowing in the first electrical storage device increases, and the closed circuit voltage of the first electrical storage device may become lower than the static voltage of the second electrical storage device. In this case, the second turns to discharge, and unintended electrical current may flow through the voltage converter from the second electrical storage device side to the first electrical storage device side.

The present invention has an object of providing a power supply system which can suppress unintended discharge from the second electrical storage device, in a voltage converter connecting a high-voltage first electrical storage device and a low-voltage second electrical storage device.

A power supply system (for example, the power supply system 1 described later) according to a first aspect of the present invention includes: a first power circuit (for example, the first power circuit 2 described later) having a first electrical storage device (for example, the first battery B1 described later) and a first power line (for example, the first power lines 21p, 21n described later) to which the first electrical storage device is connected; a second power circuit (for example, the second power circuit 3 described later) having a second electrical storage device (for example, the second battery B2 described later) having a use voltage range relative to closed circuit voltage which overlaps the first electrical storage device, and a static voltage which is lower than the first electrical storage device, and a second power line (for example, the second power lines 31p, 31n described later) to which the second electrical storage device is connected; a voltage converter (for example, the voltage converter 5 described later) which converts voltage between the first power line and the second power line; a power converter (for example, the power converter 43 described later) which converts power between the first power line and a rotary electrical machine (for example, the drive motor M described later); a first voltage acquisition unit (for example, the electronic control unit group 7, and first battery sensor unit 81 described later) which acquires a first voltage (for example, the first closed circuit voltage lower limit CCVmin1) of the first electrical storage device; a second voltage acquisition unit (for example, the electronic control unit group 7, and second battery sensor unit 82 described later) which acquires a second voltage (for example, the second closed circuit voltage lower limit CCVmin2) of the second electrical storage device; a requested power acquisition unit (for example, the pedals P and management ECU 71 described later) which acquires a requested power for the rotary electrical machine; and a power control unit (for example, the electronic control unit group 7 described later) which operates the power converter, the voltage converter and the second power circuit based on the requested power, in which the power control unit isolates the second electrical storage device from the second power line, in a case of a voltage difference between the first voltage and the second voltage becoming less than a first voltage difference threshold (for example, the first voltage difference threshold A described later), while an output limit of the second electrical storage device is being requested.

According to a second aspect of the present invention, in this case, it is preferable for the power control unit to operate the voltage converter so that an absolute value of input/output power of the second electrical storage device becomes no more than a power threshold (for example, the power threshold B described later), in a case of the voltage difference becoming less than the first voltage difference threshold, while an output limit of the second electrical storage device is being requested, and to isolate the second electrical storage device from the second power line, after the input/output power of the second electrical storage device becomes no more than the power threshold.

According to a third aspect of the present invention, in this case, it is preferable for the power control unit to connect the second electrical storage device to the second power line, in a case of an output limit of the second electrical storage device being released after isolating the second electrical storage device from the second power line, or a case of the voltage difference becoming at least a second voltage difference threshold (for example, the second voltage threshold C described later).

According to a fourth aspect of the present invention, in this case, it is preferable for the first voltage acquisition unit and the second voltage acquisition unit to respectively acquire lower limits for closed circuit voltages of the first electrical storage device and the second electrical storage device as the first voltage and the second voltage.

The power supply system as described in the first aspect of the present invention connects the first power circuit having the first electrical storage device, and the second power circuit having the second electrical storage device which has a use voltage range for the closed circuit voltage that overlaps the first electrical storage device and a static voltage which is lower than the first electrical storage device by the voltage converter, and connects the first power circuit and the rotary electrical machine by the power converter. The electronic control unit operates the power converter, voltage converter and second power circuit, based on the requested power for the rotary electrical machine. With such a power supply system, when the requested power increases in response to an acceleration request, for example, the electronic control unit operates the power converter and/or voltage converter so that the output power according to the requested power is supplied from the power circuit to the rotary electrical machine, and combines the power outputted from the first electrical storage device and the power outputted from the second electrical storage device. Herein, in the case of wanting to suppress (including inhibit) discharge from the second electrical storage device for any reason, the electronic control unit operates the voltage converter and/or power converter so that all or a majority of the requested power is covered by the power outputted from the first electrical storage device. However, when electrical current flowing in the first electrical storage device increases, there are cases where the closed circuit voltage of the first electrical storage device becomes lower than the static voltage of the second electrical storage device, and unintended power is outputted from the second electrical storage device. In contrast, with the present invention, in the case of the voltage difference between the first voltage of the first electrical storage device and the second voltage of the second electrical storage device becoming less than the first voltage difference threshold while output limitation of the second electrical storage device is being requested, the second electrical storage device is isolated from the second power line of the second power circuit. Consequently, according to the present invention, since the second electrical storage device is reliably detached from the second power line, and thus the first power circuit, it is possible to reliably suppress unintended discharge from the second electrical storage device.

It should be noted that, in Japanese Unexamined Patent Application, Publication No. 2020-162251 by the present applicant, technology is shown for suppressing unintended discharge from the second electrical storage device by operating the power converter so that the output power of the first electrical storage device does not exceed a limit power calculated based on the state of the second electrical storage device. For this reason, according to the technology shown in Japanese Unexamined Patent Application, Publication No. 2020-162251, it is necessary to limit the output power of the first electrical storage device, and it may become impossible to supply the requested power to the rotary electrical machine; whereas, according to the present invention, since there is no necessity to suppress the output power of the first electrical storage device, it is possible to continuously supply the requested power to the rotary electrical machine, while suppressing unintended discharge from the second electrical storage device.

In the second aspect of the present invention, the power control unit, in the case of the voltage difference becoming less than the first voltage difference threshold while output limitation of the second electrical storage device is being requested, operates the voltage converter so that the absolute value for the I/O power of the second electrical storage device becomes no more than the power threshold, and after the I/O power of the second electrical storage device becomes no more than the power threshold, isolates the second electrical storage device from the second power lines. It is thereby possible to suppress the influence on vehicle behavior by isolating the second electrical storage device form the second power lines, in a state in which discharge current or charge current is flowing to the second electrical storage device.

In the third aspect of the present invention, the power control unit connects the second electrical storage device to the second power line, in the case of the output limitation of the second electrical storage device being released after isolating the second electrical storage device from the second power lines, or in the case of the voltage difference becoming at least the second voltage difference threshold. It is thereby possible to supply power from the second electrical storage device to the first power circuit promptly in the case of the necessity arising.

In the fourth aspect of the present invention, the first and second voltage acquisition unit respectively acquire the lower limits for the closed circuit voltage of the first and second electrical storage devices as the first and second voltages. It is thereby possible to isolate the second electrical storage device from the second power lines at the appropriate timing, so as to reliably suppress unintended discharge from the second electrical storage device.

DETAILED DESCRIPTION OF THE INVENTION

Figure 1:
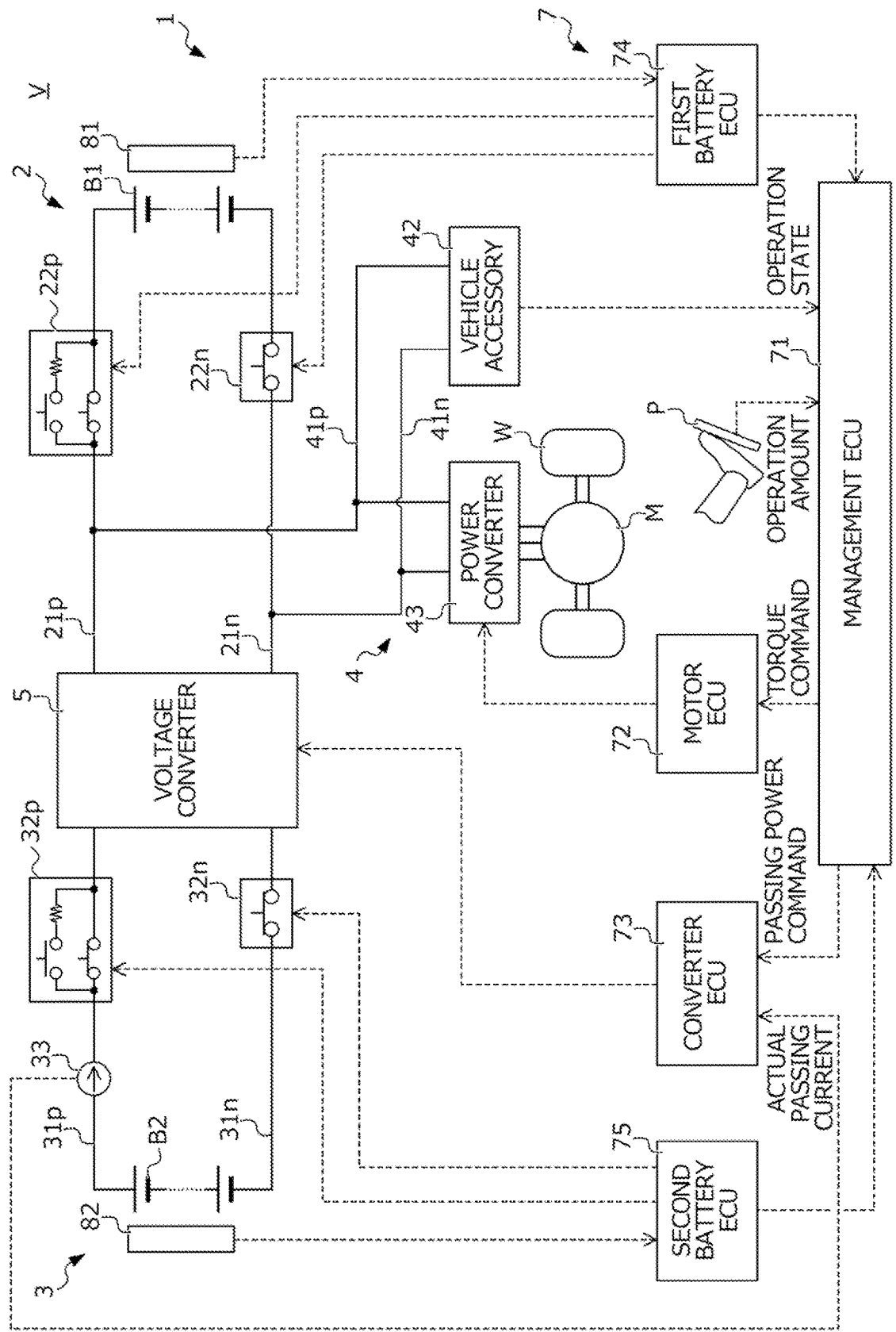
FIG. 1 is a view showing the configuration of a vehicle equipped with a power supply system according to an embodiment of the present invention.

Hereinafter, an embodiment of the present invention will be explained while referencing the drawings. FIG. 1 is a view showing the configuration of an electric vehicle V (hereinafter simply referred to as "vehicle") equipped with a power supply system 1 according to the present embodiment.

The vehicle V includes drive wheels W, a drive motor M serving as a rotary electrical machine coupled to these drive wheels W; and a power supply system 1 which performs transferring of power between this drive motor M and a first battery B1 and second battery B2 described later. It should be noted that the present embodiment explains an example in which the vehicle V accelerates and decelerates by the motive power generated mainly by the drive motor M; however, the present invention is not to be limited thereto. The vehicle V may be established as a so-called hybrid vehicle equipped with the drive motor M and an engine as the motive power generation source.

The drive motor M is coupled to the drive wheels W via a power transmission system which is not illustrated. The torque generated by the drive motor M by supplying three-phase electricity to the drive motor M from the power supply system 1 is transferred to the drive wheels W via the power transmission system which is not illustrated, causing the drive wheels W to rotate to make the vehicle V travel. In addition, the drive motor M exhibits a function of a generator during deceleration of the vehicle V, generates regenerative electric power, and gives the regenerative braking torque to the drive wheels W responsive to the magnitude of this regenerative electric power. The regenerative electric power generated by the drive motor M is charged to the batteries B1, B2 of the power supply system 1 as appropriate.

The power supply system 1 includes: a first power circuit 2 having the first battery B1; a second power circuit 3 having the second battery B2; a voltage converter 5 connecting this first power circuit 2 and second power circuit 3; a load circuit 4 having various electrical loads including the drive motor M; and an electronic control unit group 7 serving as a power control unit for controlling the flow of power to these circuits 2, 3, 4, by operating these power circuits 2, 3, 4 and the voltage converter 5. The electronic control unit group 7 includes a management ECU 71, motor ECU 72, converter ECU 73, first battery ECU 74 and second battery ECU 75, which are each computers.

The first battery B1 is a secondary battery capable of both discharging which converts chemical energy into electrical energy, and charging which converts the electrical energy into chemical energy. Hereinafter, a case is explained using a so-called lithium-ion battery which performs charging/discharging by the lithium ions migrating between electrodes as this first battery B1; however, the present invention is not limited thereto.

A first battery sensor unit 81 for estimating the internal state of the first battery B1 is provided to the first battery B1. The first battery sensor unit 81 detects a physical quantity required in order to acquire the charge rate of the first battery B1 (value expressing the charged amount of the battery by percentage), the temperature, etc. in the first battery ECU 74, and is configured by a plurality of sensors which send signals according to the detection value to the first battery ECU 74. More specifically, the first battery sensor unit 81 is configured by a voltage sensor that detects the terminal voltage of the first battery B1, a current sensor that detects the electrical current flowing in the first battery B1, a temperature sensor that detects the temperature of the first battery B1, etc.

The second battery B2 is a secondary battery capable of both discharging that converts chemical energy into electrical energy, and charging that converts electrical energy into chemical energy. Hereinafter, a case is explained using a so-called lithium-ion battery which performs charging/discharging by the lithium ions migrating between electrodes as this second battery B2; however, the present invention is not limited thereto. The second battery B2 may employ capacitors, for example.

A second battery sensor unit 82 for estimating the internal state of the second battery B2 is provided to the second battery B2. The second battery sensor unit 82 detects a physical quantity required for acquiring the charge rate, temperature, etc. of the second battery B2 in the second battery ECU 75, and is configured by a plurality of sensors which send signals according to the detection value to the second battery ECU 75. More specifically, the second battery sensor unit 82 is configured by a voltage sensor that detects terminal voltage of the second battery B2, a current sensor that detects the electrical current flowing in the second battery B2, a temperature sensor that detects the temperature of the second battery B2, etc.

Herein, the characteristics of the first battery B1 and the characteristics of the second battery B2 are compared. The first battery B1 has lower output weight density and higher energy weight density than the second battery B2. In addition, the first battery B1 has larger capacity than the second battery B2. In other words, the first battery B1 is superior to the second battery B2 in the point of energy weight density. It should be noted that energy weight density is the electrical energy per unit weight (Wh/kg), and the output weight density is the power per unit weight (W/kg). Therefore, the first battery B1 which excels in the energy weight density is a capacitive battery with the main object of high capacity and the second battery B2 which excels in output weight density is an output-type battery with the main object of high output. For this reason, the power supply system 1 uses the first battery B1 as the main power source, and uses the second battery B2 as an auxiliary power source which supplements the first battery B1.

Figure 2:
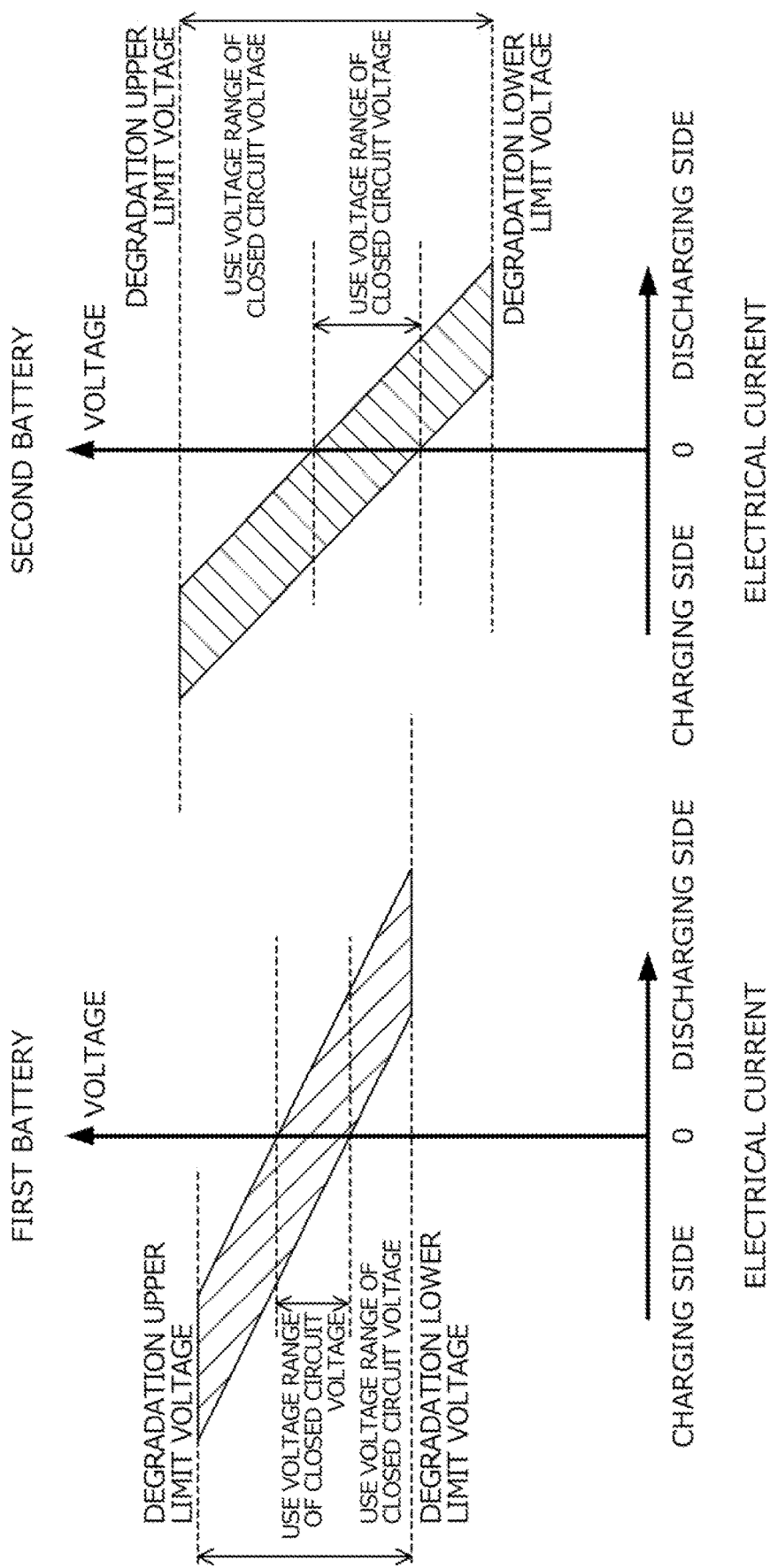
FIG. 2 provides graphs comparing use voltage ranges of a first battery and a second battery.

FIG. 2 provides graphs comparing the use voltage ranges of the first battery B1 and second battery B2 in the power supply system 1. In FIG. 2, the left side is a graph showing the use voltage range of the first battery B1, and the right side is a graph showing the use voltage range of the second battery B2. In FIG. 2, the horizontal axis showing the electrical current flowing in the battery, and the vertical axis shows the voltage of the battery.

As shown in FIG. 2, the static voltage of the batteries B1, B2 (i.e. voltage in a state in which electrical current is not flowing to the battery, referred to as open circuit voltage) has a characteristic of rising with higher charge rate. Therefore, the upper limit for the use voltage ranges relative to static voltage of the batteries B1, B2 are static voltages of each when the charge rate is the maximum value (e.g., 100%), and the lower limit is the static voltage of each when the charge rate is the minimum value (e.g., 0%). As shown in FIG. 2, the upper limit for the use voltage range relative to static voltage of the second battery B2 is lower than the upper limit for the use voltage range relative to the static voltage of the first battery B1. For this reason, the static voltage of the second battery B2 during travel of the vehicle V is basically maintained lower than the static voltage of the first battery B1.

As shown in FIG. 2, there is a characteristic in which the closed circuit voltage of the batteries B1, B2 (i.e. voltage in a state in which electrical current is flowing to the battery) also rises with higher charge rate. In addition, since internal resistance exists in the batteries B1, B2, the closed circuit voltage thereof has a characteristic of lowering from the static voltage as the discharge current increases, and rising from the static voltage as the charge current increases. Therefore, the upper limit of the use voltage range for the closed circuit voltage of the batteries B1, B2 is higher than the upper limit of the use voltage range for each static voltage, and the lower limit is lower than the lower limit of the use voltage range relative to each static voltage. In other words, the use voltage range for the closed circuit voltage of the batteries B1, B2 includes the use voltage range for each static voltage. As shown in FIG. 2, the use voltage range for the closed circuit voltage of the first battery B1 overlaps the use voltage range for the closed circuit voltage of the second battery B2.

In addition, since the degradation of the batteries B1, B2 is promoted when the charge current increases excessively, the upper limit of the use voltage range for the closed circuit voltage of these batteries B1, B2 is set so that these batteries B1, B2 will not degrade, based on the states of these batteries B1, B2. Hereinafter, the upper limit of the use range of the closed circuit voltage of these batteries B1, B2 is also referred to as degradation upper limit voltage.

In addition, when the discharge current increases excessively, since the degradation of the batteries B1, B2 is promoted, the lower limit of the use voltage range for the closed circuit voltage of these batteries B1, B2 is set so that these batteries B1, B2 will not degrade, based on the states of these batteries B1, B2. Hereinafter, the lower limit of the use range of the closed circuit voltage of these batteries B1, B2 is also referred to as degradation lower limit voltage.

Referring back to FIG. 1, the first output circuit 2 includes: the first battery B1, first power lines 21p, 21n which connect both positive and negative poles of this first battery B1 and the positive terminal and negative terminal on the high-voltage side of the voltage converter 5, and a first positive contactor 22p and first negative contactor 22n provided to these first power lines 21p, 21n.

The first contactors 22p, 22n are normal open type which opens in a state in which a command signal from outside is not being inputted and breaks conduction between both electrodes of the first battery B1 and the first power lines 21p, 21n; and closes in a state in which a command signal is being inputted and connects the first battery B1 and first power lines 21p, 21n. These first contactors 22p, 22n open/close according to a command signal transmitted from the first battery ECU 74. It should be noted that the first positive contactor 22p is a pre-charge contactor having a pre-charge resistance for mitigating the inrush current to a plurality of smoothing capacitors provided to the first power circuit 2, load circuit 4, etc.

The second power circuit 3 includes: the second battery B2, second power lines 31p, 31n which connect both positive and negative poles of this second battery B2 and the positive terminal and negative terminal on the low-voltage side of the voltage converter 5, a second positive contactor 32p and second negative contactor 32n provided to these second power lines 31p, 31n, and a current sensor 33 provided to the second power line 31p.

The second contactors 32p, 32n are normal-open type which open in a state in which a command signal from outside is not being inputted to break conduction between both electrodes of the second battery B2 and the second power lines 31p, 31n (i.e. isolate the second battery B2 from the second power lines 31p, 32n), and close in a state in which a command signal is being inputted to connect between the second battery B2 and the second power lines 31p, 31n. These second contactors 32p, 32n open/close in response to a command signal transmitted from the second battery ECU 75. It should be noted that the second cathode contactor 32p is a pre-charge contactor having a pre-charge resistance for mitigating the inrush current to a plurality of smoothing capacitors provided to the first power circuit 2, load circuit 4, etc.

The electric current sensor 33 sends a detection signal according to a value of passing current, which is the electrical current flowing through the second power line 31p, i.e. electrical current flowing through the voltage converter 5, to the converter ECU 73. It should be noted that, in the present embodiment, the direction of passing current defines from the second power circuit 3 side to the first power circuit 2 side as positive, and defines from the first power circuit 2 side to the second power circuit 3 side as negative.

The load circuit 4 includes: a vehicle accessory 42, output converter 43 to which the drive motor M is connected, and load power lines 41p, 41n which connect this vehicle accessory 42 and output converter 43 with the first power circuit 2.

The vehicle accessory 42 is configured by a plurality of electrical loads such as a battery heater, air compressor, DC/DC converter, and onboard charger. The vehicle accessory 42 is connected to the first power lines 21p, 21n of the first power circuit 2 by the load power lines 41p, 41n, and operates by consuming the electric power of the first power lines 21p, 21n. The information related to the operating state of various electrical loads constituting the vehicle accessory 42 is sent to the management ECU 71, for example.

The power converter 43 is connected to the first power lines 21p, 21n so as to be parallel with the vehicle accessory 42, by the load power lines 41p, 41n. The power converter 43 converts the electric power between the first power lines 21p, 21n and the drive motor M. The power converter 43, for example, is a PWM inverter according to pulse width modulation, provided with a bridge circuit configured by a bridge connecting a plurality of switching elements (e.g., IGBT), and is equipped with a function of converting between DC power and AC power. The power converter 43 is connected to the first power lines 21p, 21n on the DC I/O side thereof, and is connected to each coil of the U phase, V phase and W phase of the drive motor M at the AC I/O side thereof. By ON/OFF driving the switching elements of each phase in accordance with a gate drive signal generated at a predetermined timing from a gate drive circuit (not shown) of the motor ECU 72, the power converter 43 converts the DC power of the first power lines 21p, 21n into three-phase AC power and supplies to the drive motor M, and converts the three-phase AC power supplied from the drive motor M into DC power and supplies to the first power lines 21p, 21n.

The voltage converter 5 connects the first power circuit 2 and second power circuit 3, and converts the voltage between both circuits 2, 3. A known boost circuit is used in this voltage converter 5.

Figure 3:
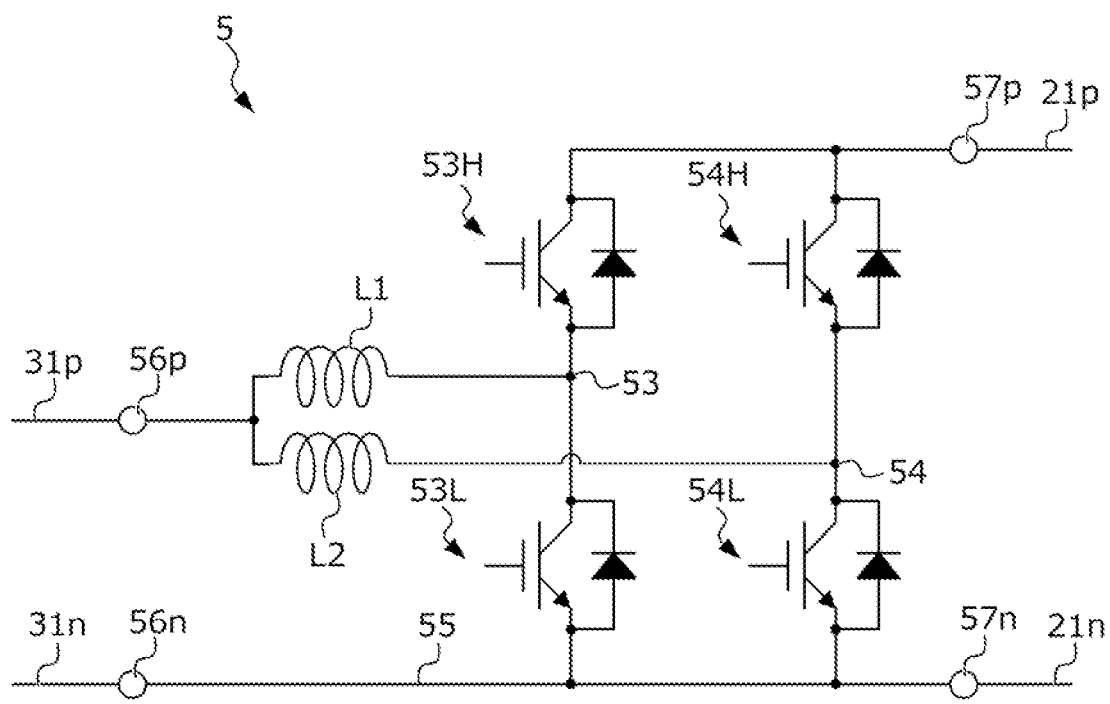
FIG. 3 is a view showing an example of the circuit configuration of a voltage converter.

FIG. 3 is a view showing an example of the circuit configuration of the voltage converter 5. The voltage converter 5 connects the first power lines 21p, 21n to which the first battery B1 is connected, and the second power lines 31p, 31n to which the second battery B2 is connected, and converts the voltage between these first power lines 21p, 21n and second power lines 31p, 31n. The voltage converter 5 is a full-bridge DC/DC converter configured by combining a first reactor L1, a second reactor L2, a first high-arm element 53H, a first low-arm element 53L, a second high-arm element 54H, a second low-arm element 54L, a negative bus 55, low-voltage side terminals 56p, 56n, high-voltage side terminals 57p, 57n, and a smoothing capacitor (not shown).

The low-voltage side terminals 56p, 56n are connected to the second power lines 31p, 31n, and the high-voltage side terminals 57p, 57n are connected to the first power lines 21p, 21n. The negative bus 55 is wiring connecting the low-voltage side terminal 56n and high-voltage side terminal 57n.

The first reactor L1 has one end side thereof connected to the low-voltage side terminal 56p, and the other end side connected to a connector node 53 between the first high-arm element 53H and first low-arm element 53L. The first high-arm element 53H and first low-arm element 53L each include a well-known power switching element such as IGBT or MOSFET, and a freewheeling diode connected to this power switching element. This high-arm element 513H and low-arm element 53L are connected in this order in series between the high-voltage side terminal 57p and negative bus 55.

A collector of the power switching element of the first high-arm element 53H is connected to the high-voltage side terminal 57p, and the emitter thereof is connected to the collector of the first low-arm element 53L. The emitter of the power switching element of the first low-arm element 53L is connected to the negative bus 55. The forward direction of the freewheeling diode provided to the first high-arm element 53H is a direction from the first reactor L1 towards the high-voltage side terminal 57p. In addition, the forward direction of the freewheeling diode provided to the first low-arm element 53L is a direction from the negative bus 55 towards the first reactor L1.

The second reactor L2 has one end side connected to the low-voltage side terminal 56p, and the other end side connected to a connection node 54 between the second high-arm element 54H and second low-arm element 54L. The second high-arm element 54H and second low-arm element 54L each include a well-known power switching element such as IGBT or MOSFET, and a freewheeling diode connected to this power switching element. This high-arm element 54H and low-arm element 54L are connected in this order in series between the high-voltage side terminal 57p and negative bus 55.

A collector of the power switching element of the second high-arm element 54H is connected to the high-voltage side terminal 57p, and the emitter thereof is connected to the collector of the second low-arm element 54L. The emitter of the power switching element of the second low-arm element 54L is connected to the negative bus 55. The forward direction of the freewheeling diode provided to the second high-arm element 54H is a direction from the second reactor L2 towards the high-voltage side terminal 57p. In addition, the forward direction of the freewheeling diode provided to the second low-arm element 54L is a direction from the negative bus 55 towards the second reactor L2.

The voltage converter 5 converts the voltage between the first power lines 21p, 21n and the second power lines 31p, 31n, by alternately driving ON/OFF the first high-arm element 53H and second low-arm element 54L, and the first low-arm element 53L and second high-arm element 54, in accordance with the gate drive signal generated at a predetermined timing from a gate drive circuit (not shown) of the converter ECU 73.

As explained by referencing FIG. 2, the static voltage of the second battery B2 during travel of the vehicle V is basically maintained lower than the static voltage of the first battery B1. Therefore, the voltage of the first power lines 21p, 21n is basically higher than the voltage of the second power lines 31p, 31n. Therefore, the converter ECU 73, in a case of driving the drive motor M using both the power outputted from the first battery B1 and the power outputted from the second battery B2, operates the voltage converter 5 so that a boost function is exhibited in the voltage converter 5. Boost function refers to a function of stepping up the power of the second power lines 31p, 31n to which the low-voltage side terminals 56p, 56n are connected, and outputting to the first power lines 21p, 21n to which the high-voltage side terminals 57p, 57n are connected, whereby positive passing current flows from the second power lines 31p, 31n side to the first power lines 21p, 21n side. In addition, in the case of suppressing discharge of the second battery B2, and driving the drive motor M with only the power outputted from the first battery B1, the converter ECU 73 is configured so as to turn OFF the voltage converter 5, and make so that electrical current does not flow from the first power lines 21p, 21n to the second power lines 31p, 31n. However, in this case, when the voltage of the second power lines 31p, 31n becomes higher than the voltage of the first power lines 21p, 21n, the second battery B2 turns to discharge, and positive passing current may flow from the second power lines 31p, 31n to the first power lines 21p, 21n via the freewheeling diodes of the high-arm elements 53H, 54H.

In addition, in the case of charging the first battery B1 or second battery B2 by the regenerative electric power outputted from the drive motor M to the first power lines 21p, 21n during deceleration, the converter ECU 73 operates the voltage converter 5 so as to exhibit a step-down function in the voltage converter 5. Step-down function refers to a function of stepping down the electric power in the first power lines 21p, 21n to which the high-voltage side terminals 57p, 57n are connected, and outputting to the second power lines 31p, 31n to which the low-voltage side terminals 56p, 56n are connected, whereby negative passing current flows from the first power lines 21p, 21n side to the second power lines 31p, 31n side.

Referring back to FIG. 1, the first battery ECU 74 is a computer mainly handling state monitoring of the first battery B1 and the ON/OFF operation of the contactors 22p, 22n of the first power circuit 2. The first battery ECU 74, based on a known algorithm using the detection value sent from the first battery sensor unit 81, calculates various parameters representing the internal state of the first battery B1, more specifically, the cell voltage of each cell constituting the first battery B1, the temperature of the first battery B1, internal resistance of the first battery B1, closed-circuit voltage of the first battery B1, degradation upper limit voltage of the first battery B1, degradation lower limit voltage of the first battery B1, current of the first battery B1, first output upper limit which is the upper limit for power which can be outputted from the first battery B1, charge rate of the first battery B1, etc. The information related to the parameters representing the internal state of the first battery B1 acquired in the first battery ECU 74 is sent to the management ECU 71, for example.

The second battery ECU 75 is a computer mainly handling state monitoring of the second battery B2 and open/close operation of the contactors 32p, 32n of the second power circuit 3. The second battery ECU 75, based on a known algorithm using the detection value sent from the second battery sensor unit 82, calculates various parameters representing the internal state of the second battery B2, more specifically, the cell voltage of each cell constituting the second battery B2, the temperature of the second battery B2, internal resistance of the second battery B2, closed-circuit voltage of the second battery B2, degradation upper limit voltage of the second battery B2, degradation lower limit voltage of the second battery B2, current of the second battery B2, second output upper limit which is the upper limit of power which can be outputted from the second battery B2, charge rate of the second battery B2, etc. The information related to the parameters representing the internal state of the second battery B2 acquired in the second battery ECU 75 is sent to the management ECU 71, for example.

The management ECU 71 is a computer managing mainly the flow of electric power in the overall power supply system 1. The management ECU 71 generates a torque command signal corresponding to a command related to the torque generated by the drive motor M, and a passing power command signal corresponding to a command related to electric power passing through the voltage converter 5, by executing the power management processing explained by referencing FIG. 4 later.

The motor ECU 72 is a computer mainly managing the flow of electric power from the first power circuit 2 to the electric motor M. Based on the torque command signal sent from the management ECU 71, the motor ECU 72 operates the power converter 43 so that the torque according to this command generates in the drive motor M.

The converter ECU 73 is a computer which manages the flow of passing power, which is electric power passing through the voltage converter 5 mainly. The converter ECU 73 operates the voltage converter 5 so that passing power according to the command passes through the voltage converter 5, in response to the passing power command signal sent from the management ECU 71. More specifically, the converter ECU 73, based on the passing power command signal, calculates the target current, which is the target relative to the passing current of the voltage converter 5, and operates the voltage converter 5 following a known feedback control algorithm, so that passing current (hereinafter referred to as "actual passing current") detected by the current sensor 33 becomes the target current.

Figure 4:
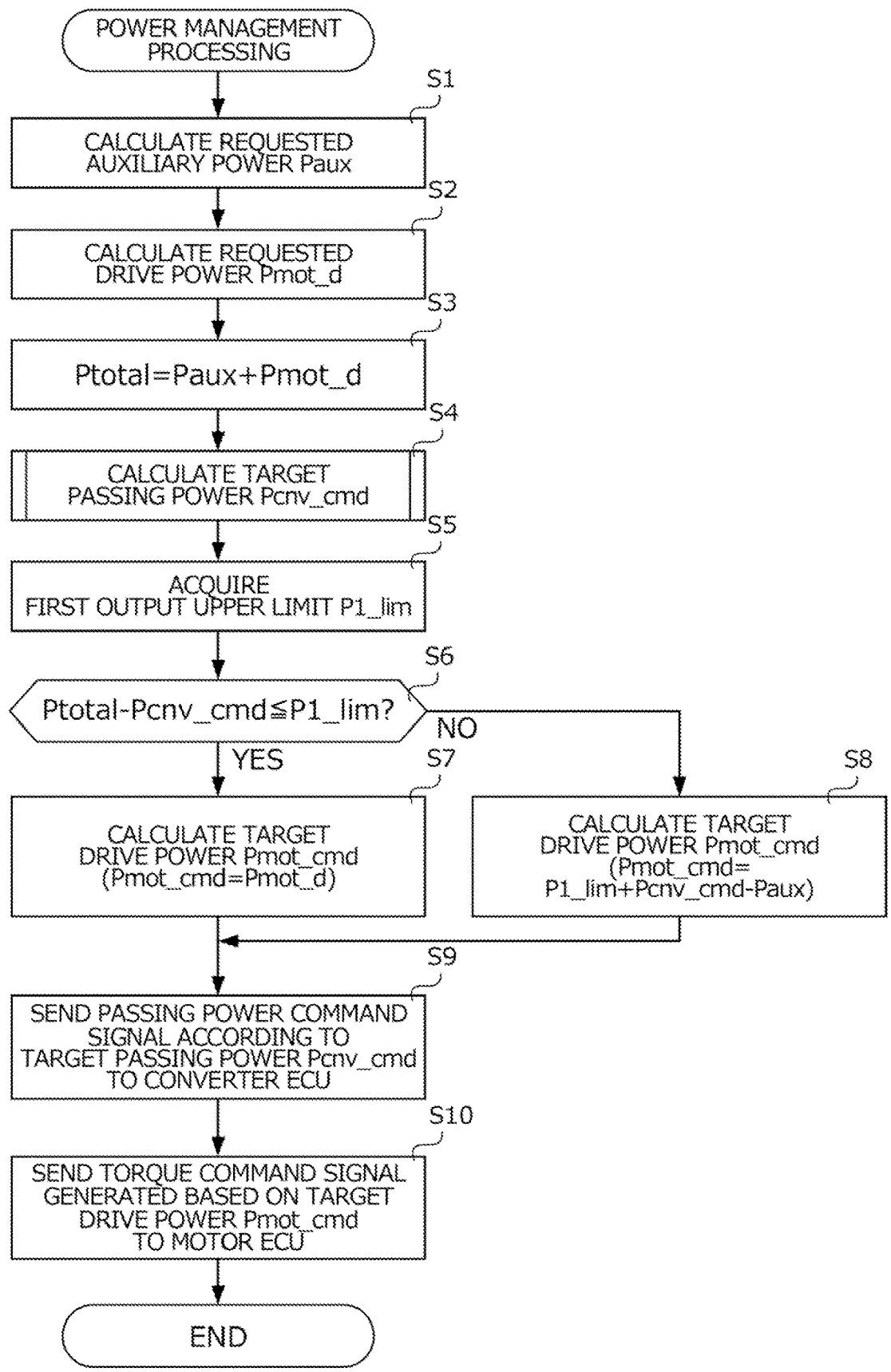
FIG. 4 is a flowchart showing a specific sequence of power management.

FIG. 4 is a flowchart showing the specific sequence of the power management processing. This power management processing is repeatedly executed at a predetermined period in the management ECU 71.

First, in Step S1, the management ECU 71 calculates the requested auxiliary power Paux, which is the power requested in the vehicle auxiliary 42, and then advances to Step S2. The management ECU 71 calculates the requested auxiliary power Paux, based on the information related to the operating state of various electrical loads sent from the vehicle auxiliary 42.

Next, in Step S2, the management ECU 71 calculates the requested drive power Pmot_d, which is the power required in the drive motor M, and then advances to Step S3. The management ECU 71 calculates the requested drive torque by the driver, based on the operation amount of the pedals P (refer to FIG. 1) such as the accelerator pedal and brake pedal by the driver, and calculates the requested drive power Pmot_d by converting this requested drive torque into power. Therefore, in the present embodiment, the requested power acquisition unit is configured by the pedals P and management ECU 71.

Next, in Step S3, the management ECU 71 calculates the total requested power Ptotal by summing the requested auxiliary power Paux and the requested drive power Pmot_d, and then advances to Step S4.

Next, in Step S4, the management ECU 71 calculates the target passing power Pcnv_cmd corresponding to the target for the passing power in the voltage converter 5 (i.e. I/O power of the second battery B2), and then advances to Step S5. It should be noted that the specific sequence of calculating this target passing power Pcnv_cmd will be explained later by referencing FIG. 5.

Next, in Step S5, the management ECU 71 acquires the first output upper limit P1_lim corresponding to the upper limit for the power which can be outputted from the first battery B1, and then advances to Step S6.

Next, in Step S6, the management ECU 71 determines whether the power obtained by subtracting the target passing power Pcnv_cmd from the total requested power Ptotal is no more than the first output upper limit P1_lim. Herein, power obtained by subtracting the target passing power Pcnv_cmd from the total requested power Ptotal corresponds to the request for output power of the first battery B1. Therefore, the determination in Step S6 corresponds to determining whether the output power of the first battery B1 can satisfy the request from the driver without exceeding the first output upper limit P1_lim. The management ECU 71 advances to Step S7 in the case of the determination result in Step S6 being YES, and advances to Step S8 in the case of being NO.

In Step S7, the management ECU 71 calculates the target drive power Pmot_cmd corresponding to the target for the power supplied from the first power circuit 2 to the drive motor M via the power converter 43, and then advances to Step S9. In the case of the determination result in Step S6 being YES as mentioned above, since the output power of the first battery B1 can satisfy the request of the driver without exceeding the first output upper limit P1_lim, the management ECU 71 sets the requested drive power Pmot_d calculated in Step S2 as the target drive power Pmot_cmd.

In Step S8, the management ECU 71 calculates the target drive power Pmot_cmd, and then advances to Step S9. In the case of the determination result in Step S6 being NO as mentioned above, if trying to satisfy the request of the driver, since the output power of the first battery B1 exceeds the first output upper limit P1_lim, the management ECU 71 calculates the target drive power Pmot_cmd so that the output power of the first battery B1 does not exceed the first output upper limit P1_lim. More specifically, the management ECU 71, for example, calculates the target drive power Pmot_cmd by subtracting the requested auxiliary power Paux from the sum of the first output upper limit P1_lim and the target passing power Pcnv_cmd. The output power of the first battery B1 thereby becomes the first output upper limit P1_lim, and will not exceed this first output upper limit P1_lim.

Next, in Step S9, the management ECU 71 generates the passing power command signal according to the target passing power Pcnv_cmd calculated in Step S4, sends this to the converter ECU 73, and then advances to Step S10. The converter ECU 73 operates the voltage converter 5 based on this passing power command signal. The power according to the target passing power Pcnv_cmd is thereby outputted from the second battery B2 to the first power circuit 2.

Next, in Step S10, the management ECU 71 generates a torque command signal based on the target drive power Pmot_cmd, sends this to the motor ECU 72, and then ends the power management processing. More specifically, the management ECU 71 calculates the target drive torque by converting the target drive power Pmot_cmd into torque, and generates a torque command signal according to this target drive torque. The motor ECU 72 operates the power converter 43 based on this torque command signal. The power according to the target drive power Pmot_cmd is thereby outputted from the first power circuit 2 to the drive motor M. In this way, with the management ECU 71, by generating the torque command signal based on the target drive power Pmot_cmd calculated through the processing of Step S7 or S8, the power outputted from the first battery B1 will not exceed the first output upper limit P1_lim.

Figure 5:
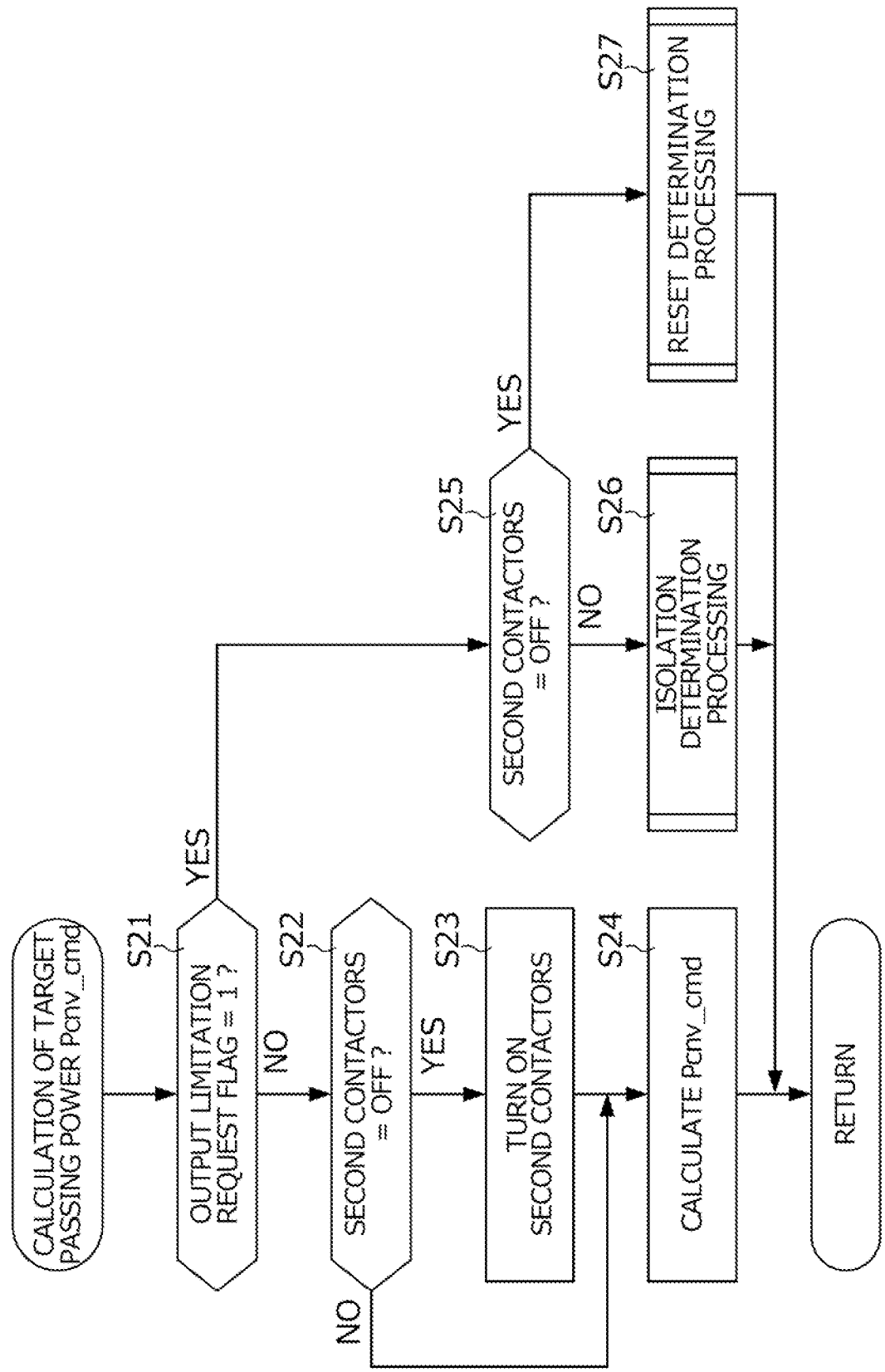
FIG. 5 is a flowchart showing a sequence of calculating a target passing power of the voltage converter.

FIG. 5 is a flowchart showing the sequence of calculating the target passing power Pcnv_cmd related to the passing power for the voltage converter 5 by the management ECU 71.

First, in Step S21, the management ECU 71 determines whether the value of an output limitation request flag of the second battery B2 is "1". This output limitation request flag of the second battery B2 is a flag indicating as being a state in which a limitation for the output power of the second battery B2 is being requested, and is updated by processing of the second battery ECU 75 which is not shown. With a general battery, there is concern over promoting degradation when discharging in a state in which the temperature is excessively high. For this reason, in the case of the temperature of the second battery B2 being higher than a degradation suppression temperature, in order to prevent degradation of this second battery B2, the second battery ECU 75 sets the value of the output limitation request flag to "1" to request an output limitation of the second battery B2. In addition, in the case of the temperature of the second battery B2 being no more than the degradation suppression temperature, the second battery ECU 75 sets the value of the output limitation request flag to "0" in order to release the output limitation of the second battery B2. The management ECU 71 advances to Step S22 in the case of the determination result in Step S21 being NO, and advances to Step 325 in the case of being YES.

In Step S22, the management ECU 71 determines whether the second contactor 32p, 32n is OFF, i.e. second contactors 32p, 32n are open, and the second battery B2 is in a state isolated from the second output lines 31p, 31n. The management ECU 71, in the case of the determination result of Step S22 being YES, advances to Step S23, and then after sending a command to turn ON the second contactors 32p, 32n to the second battery ECU 75 in order to turn ON the second contactors 32p, 32n, advances to Step S24. In addition, the management ECU 71, in the case of the determination result in Step S22 being NO, advances to Step 24, leaving the second contactor 32p, 32n turned ON.

In Step S24, the management ECU 71 returns to Step S5 in FIG. 4, after calculating the target passing power Pcnv_cmd, based on a predetermined algorithm. More specifically, the management ECU 71 calculates the target passing power Pcnv_cmd based on information related to parameters representing the internal state of the first battery B1 sent from the first battery ECU 74, information related to parameters representing the internal state of the second battery B2 sent from the second battery ECU 75, the requested drive power Pmot_d, etc. In other words, the management ECU 71 sets the target passing power Pcnv_cmd as a positive predetermined value, in the case of, for example, being during acceleration and the output of power from the second battery B2 being needed, and a case of the charge rate of the second battery B2 being sufficient, and causes power to be outputted from the second battery B2. In addition, the management ECU 71 sets the target passing power Pcnv_cmd as a negative predetermined value in the case of, for example, the charge rate of the second battery B2 declining, and charging of the second battery B2 being needed, and supplies part of the power of the first power circuit 2 to the second battery B2.

In Step S25, the management ECU 71 determines whether the second contactors 32p, 32n are OFF. In the case of the determination result in Step S25 being NO, after executing isolation determination processing of turning OFF the second contactors 32p, 32n at the appropriate timing according to the states of the first battery B1, second battery B2, etc. (refer to Step S26), the management ECU 71 returns to Step S5 in FIG. 4. In addition, in the case of the determination result of Step S25 being YES, after executing reset determination processing of turning ON the second contactors 32p, 32n at the appropriate timing according to the states of the first battery B1, second battery B2, etc. (refer to Step S27), the management ECU 71 returns to Step S5 in FIG. 4.

Figure 6:
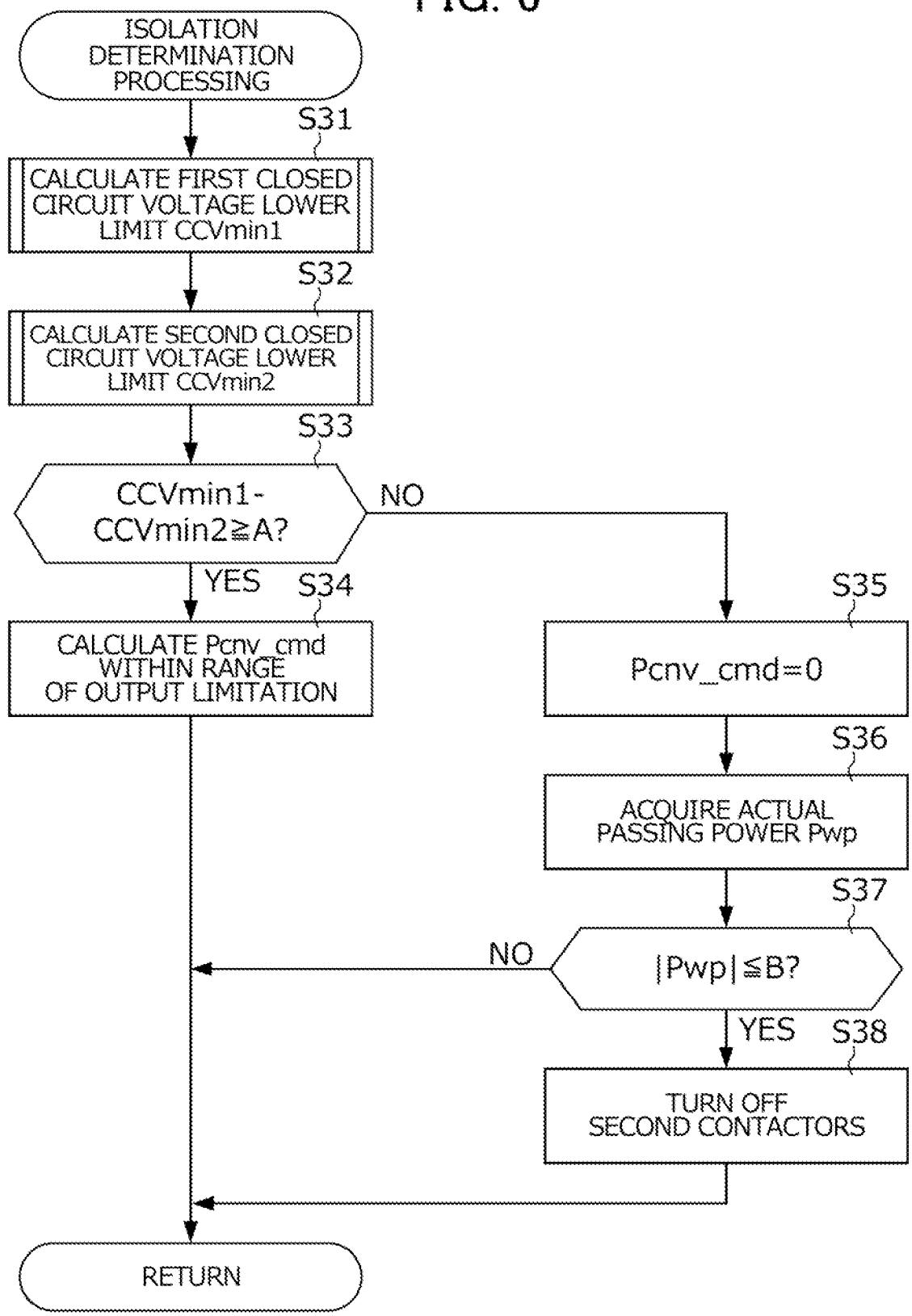
FIG. 6 is a flowchart showing a specific sequence of isolation determination processing.

FIG. 6 is a flowchart showing a specific sequence of isolation determination processing. First, in Step S31, the management ECU 71 calculates a first closed circuit voltage lower limit CCVmin1 corresponding to the lower limit for the closed circuit voltage of the first battery B1, based on various parameters representing the internal state of the first battery B1 sent from the first battery ECU 74, and then advances to Step S32. More specifically, the management ECU 71 calculates the first closed circuit voltage lower limit CCVmin1 following a sequence explained later by referencing FIG. 7.

Next, in Step S32, the management ECU 71 calculates a second closed circuit voltage lower limit CCVmin2 corresponding to the lower limit for the closed circuit voltage of the second battery B2, based on various parameters representing the internal state of the second battery B2 sent from the second battery ECU 75, and then advances to Step S33. More specifically, the management ECU 71 calculates the second closed circuit voltage lower limit CCVmin2 following a sequence explained later by referencing FIG. 8.

Next, in Step S33, the management ECU 71 determines whether the voltage difference obtained by subtracting the second closed circuit voltage lower limit CCVmin2 from the first closed circuit voltage lower limit CCVmin1 is at least a first voltage difference threshold A, which is a positive value.

The management ECU 71, in the case of the determination result in Step 333 being YES, determines that the first closed circuit voltage lower limit CCVmin1 is sufficiently higher than the second closed circuit voltage lower limit CCVmin2, and there is no unintended electrical current flowing from the second power circuit 3 to the first power circuit 2, even without turning OFF the second contactors 32p, 32n, and then advances to Step S34. In Step 334, the management ECU 71 calculates the target passing power Pcnv_cmd within a range of power limitation requested for the second battery B2, and then returns to Step S5 in FIG. 4.

The management ECU 71, in the case of the determination result in Step S33 being NO, i.e. case of the voltage difference between the first closed circuit voltage lower limit CCVmin1 and the second closed circuit voltage lower limit CCVmin2 being less than the first voltage difference threshold A, determines that there is concern over unintended electrical current flowing from the second power circuit 3 to the first power circuit 2, if not turning OFF the second contactors 32p, 32n, and then advances to Step S35.

In Step S35, the management ECU 71 sets the target passing power Pcnv_cmd as 0 to cause the passing power of the voltage converter 5 to decline to near 0 prior to turning OFF the second contactors 32p, 32n, and then advances to Step S36.

In Step S36, the management ECU 71 calculates the actual passing power Pwp of the voltage converter 5 corresponding to the I/O power of the second battery B2, based on the detection signal of the current sensor 33, and then advances to Step S37. In Step S37, the management ECU 71 determines whether the absolute value of the actual passing power Pwp is no more than a power threshold B decided as a value slightly greater than 0.

The management ECU 71, in the case of the determination result in Step S36 being NO, i.e. case of the absolute value for the actual passing power Pwp not declining to no more than the power threshold B, irrespective of setting the target passing power Pcnv_cmd to 0 in Step S35, returns to Step S5 in FIG. 4 while maintaining the second contactors 32p, 32n as ON, to standby for the absolute value of the actual passing power Pwp to decline to no more than the power threshold B.

The management ECU 71, in the case of the determination result in Step S36 being YES, i.e. case of the absolute value for the actual passing power Pwp declining to no more than the power threshold B, advances to Step S38. In Step S38, the management ECU 71, after sending a comment for turning OFF the second contactor 32p, 32n to the second battery ECU 75 in order to turn OFF the second contactor 32p, 32n, returns to Step S5 in FIG. 4.

Figure 7:
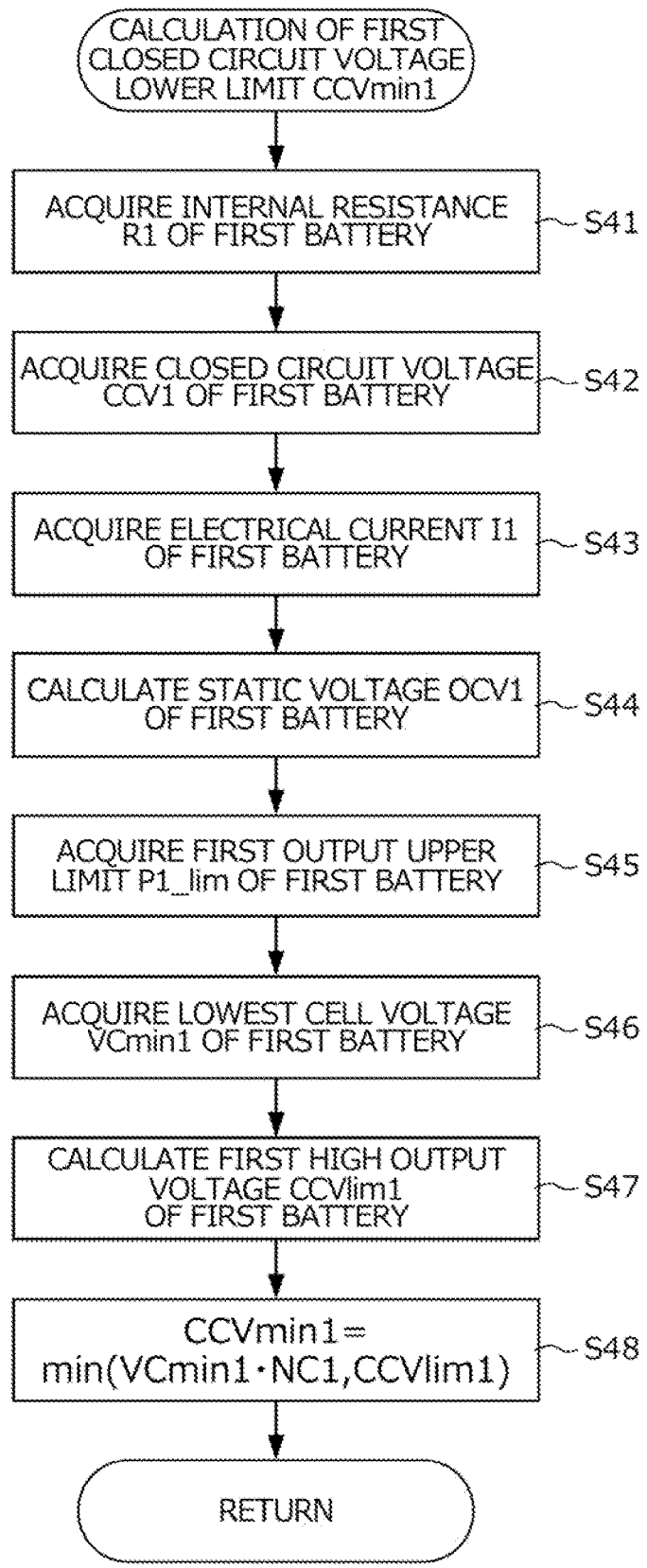
FIG. 7 is a flowchart showing a sequence of calculating a first closed circuit voltage lower limit of the first battery.

FIG. 7 is a flowchart showing a sequence of calculating the first closed circuit voltage lower limit CCVmin1 of the first battery B1.

The management ECU 71 calculates the static voltage OCV1 of the first battery B1 based on the following equation (1) (refer to Step S44), after acquiring, from the first battery ECU 74, the internal resistance R1 of the first battery B1 (refer to Step S41), the closed circuit voltage CCV1 of the first battery B1 (refer to Step S42) and the electrical current I1 of the first battery B1 (refer to Step S43).

$$OCV1=CCV1-I1 \cdot R1 \quad (1)$$

Next, the management ECU 71 calculates the first high output voltage CCVlim1 of the first battery B1 based on the following equation (2) (refer to Step $47), after acquiring, from the first battery ECU 74, the first output upper limit P1_lim of the first battery B1 (refer to Step S45) and the lowest cell voltage VCmin1 which is the lowest value among the plurality of cell voltages of the first battery B1 (refer to Step S46). It should be noted that first high output voltage CCVlim1 corresponds to the closed circuit voltage of the first battery B1 in the case of setting the output of the first battery B1 as the first output upper limit P1_lim.

$$CCV\text{lim}1 = \frac{OCV1 + \sqrt{OCV1^2 - 4 \cdot P1\_\text{lim} \cdot R1}}{2} \quad (2)$$

Next, the management ECU 71 sets the smaller one among the voltage obtained by multiplying the cell number NC1 of the first battery B1 by the lowest cell voltage VCmin1, and the first high output voltage CCVlim1, as the first closed circuit voltage lower limit CCVmin1, as shown in the following equation (3), and then ends the processing shown in FIG. 7 (refer to Step S48).

$$CCV\text{min}1=\min(VCmin1 \cdot NC1, CCV\text{lim}1) \quad (3)$$

Figure 8:
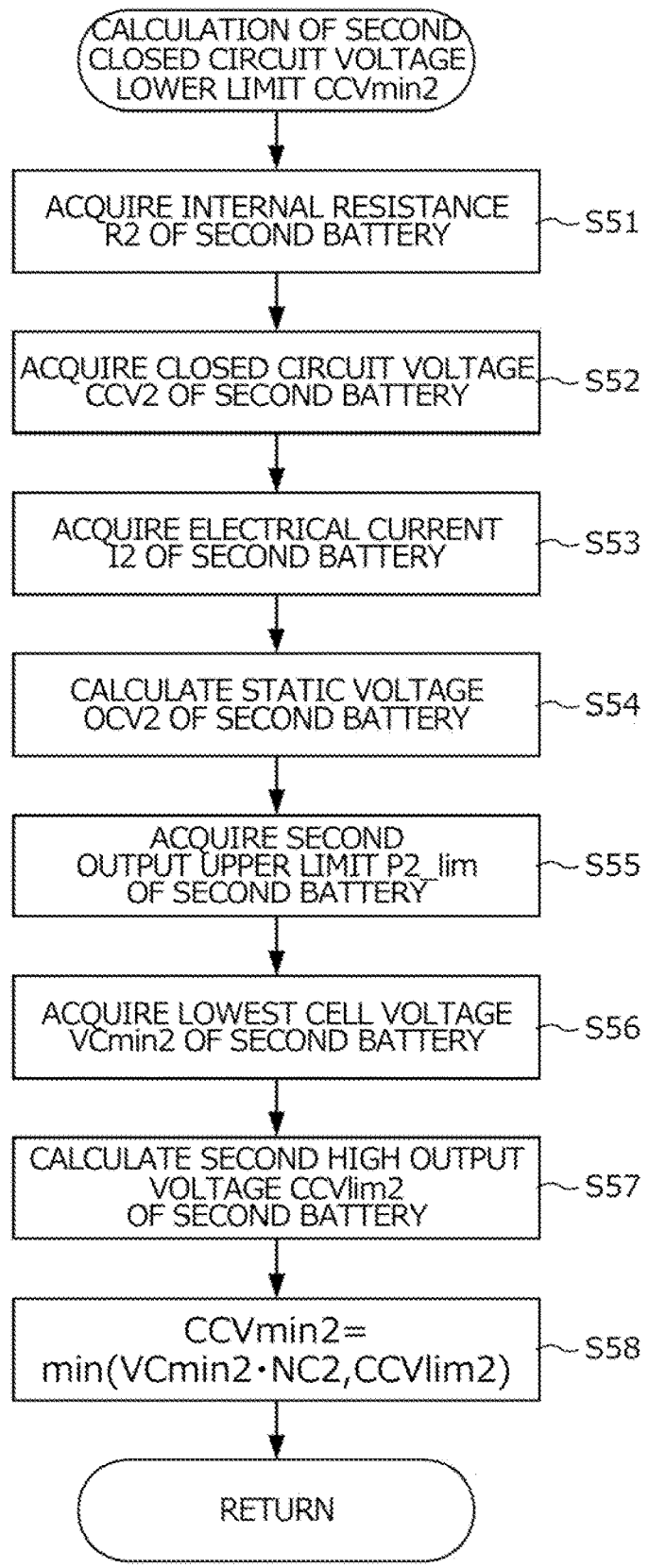
FIG. 8 is a flowchart showing a sequence of calculating a second closed circuit voltage lower limit of the second battery.

FIG. 8 is a flowchart showing a sequence of calculating the second closed circuit voltage lower limit CCVmin2 of the second battery B2.

The management ECU 71 calculates the static voltage OCV2 of the second battery B2 based on the following equation (4) (refer to Step S54), after acquiring, from the second battery ECU 75, the internal resistance R2 of the second battery B2 (refer to Step S51), the closed circuit voltage CCV2 of the second battery B2 (refer to Step S52) and the electrical current I2 of the second battery B2 (refer to Step S53).

$$OCV2=CCV2-I2 \cdot R2 \quad (4)$$

Next, the management ECU 71 calculates the second high output voltage CCVlim2 of the second battery B2 based on the following equation (5) (refer to Step S57), after acquiring, from the second battery ECU 75, the second output upper limit P2_lim of the second battery B2 (refer to Step S55) and the lowest cell voltage VCmin2 which is the lowest value among the plurality of cell voltages of the second battery B2 (refer to Step S56). It should be noted that second high output voltage CCVlim2 corresponds to the closed circuit voltage of the second battery B2 in the case of setting the output of the second battery B2 as the second output upper limit P2_lim.

$$CCV\text{lim}2 = \frac{OCV2 + \sqrt{OCV2^2 - 4 \cdot P2\_\text{lim} \cdot R2}}{2} \quad (5)$$

Next, the management ECU 71 sets the smaller one among the voltage obtained by multiplying the cell number NC2 of the second battery B2 by the lowest cell voltage VCmin2 and the second high output voltage CCVlim2 as the second closed circuit voltage lower limit CCVmin2, as shown in the following equation (6), and then ends the processing shown in FIG. 8 (refer to Step S58).

$$CCV\text{min}2=\min(VCmin2 \cdot NC2, CCV\text{lim}2) \quad (6)$$

Figure 9:
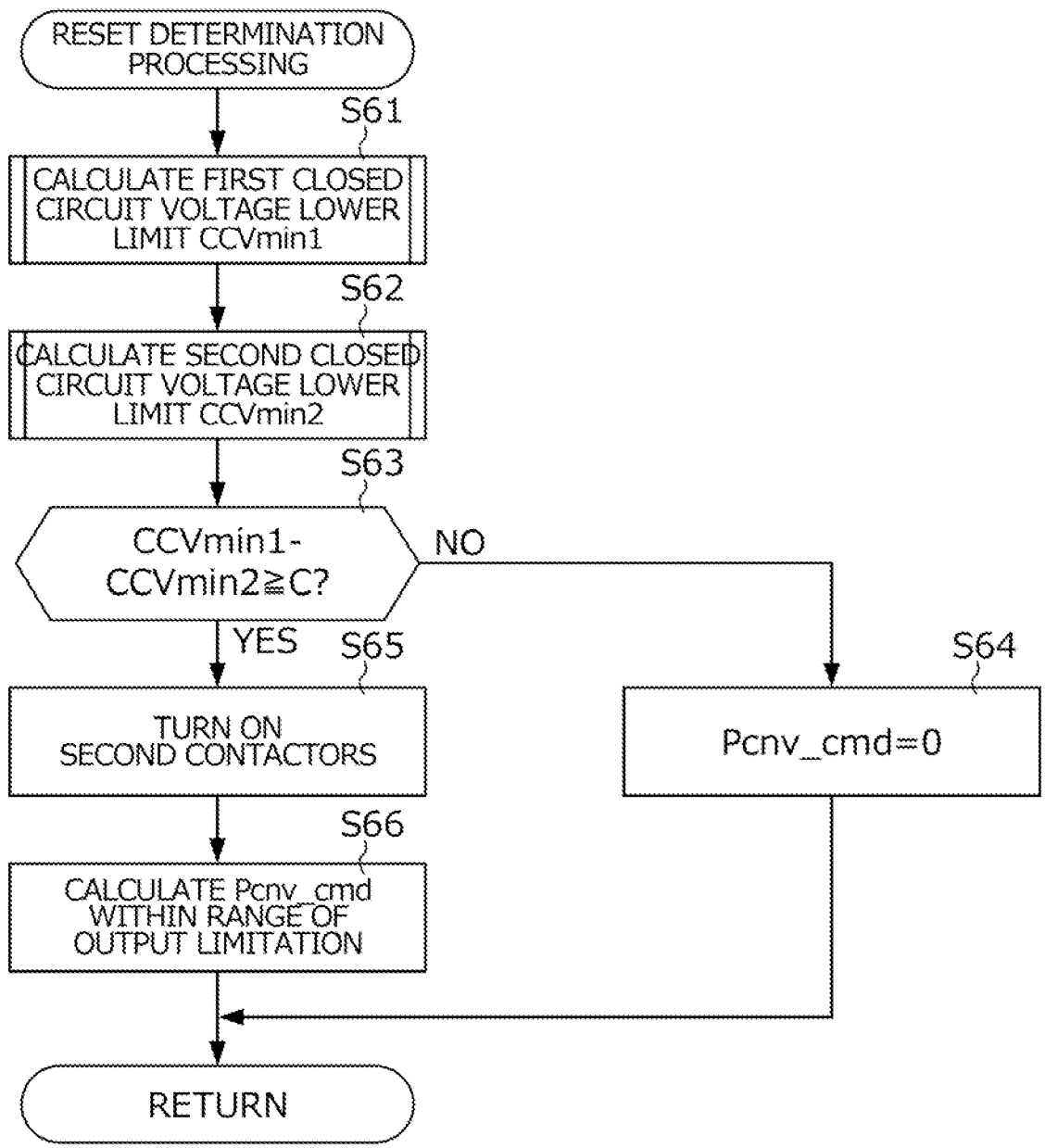
FIG. 9 is a flowchart showing a specific sequence of isolation determination processing.

FIG. 9 is a flowchart showing a specific sequence of reset determination processing. First, in Step S61, the management ECU 71 calculates the first closed circuit voltage lower limit CCVmin1 of the first battery B1 following a sequence explained by referencing FIG. 7, and then advances to Step S61. Next, in Step S62, the management ECU 71 calculates the second closed circuit voltage lower limit CCVmin2 of the second battery B2 following a sequence explained by referencing FIG. 8, and then advances to Step S63.

Next, in Step S63, the management ECU 71 determines whether the voltage difference obtained by subtracting the second closed circuit voltage lower limit CCVmin2 from the first closed circuit voltage lower limit CCVmin1 is at least a second voltage difference threshold C which is a positive value. It should be noted that, in order to prevent hunting of the second contactors 32p, 32n, the second voltage difference threshold C is set to a value somewhat greater than the first voltage difference threshold A.

The management ECU 71, in the case of the determination result in Step S63 being NO, i.e. case of the voltage difference between the first closed circuit voltage lower limit CCVmin1 and the second closed circuit voltage lower limit CCVmin2 being less than the second voltage difference threshold C, determines that there is a risk of unintended electrical current flowing from the second power circuit 3 to the first power circuit 2 when turning ON the second contactors 32p, 32n, and then advances to Step S64. In Step S64, the management ECU 71 returns to Step S5 in FIG. 4, after setting the target passing power Pcnv_cmd as 0, while maintaining the second contactors 32p, 32n as OFF.

The management ECU 71, in the case of the determination result in Step S63 being YES, determines that the first closed circuit voltage lower limit CCVmin1 is sufficiently higher than the second closed circuit voltage lower limit CCVmin2, and there will be no unintended electrical current flowing from the second power circuit 3 to the first power circuit 2, even if turning ON the second contactors 32p, 32n, and then advances to Step S65. In Step S65, the management ECU 71 advances to Step S66, after sending a command for turning ON the second contactors 32p, 32n to the second battery ECU 75 in order to turn ON the second contactors 32p, 32n. In Step S66, the management ECU 71 calculates the target passing power Pcnv_cmd within a range of the output limit being requested for the second battery B2, and then returns to Step S5 in FIG. 4.

In the above way, by the processing show in FIGS. 5 to 9, the management ECU 71, operates the voltage converter 5 so that the absolute value of the actual passing power Pwp becomes no more than the power threshold B (refer to Steps S35 to S37 in FIG. 6), in the case of the voltage difference between the first closed circuit voltage lower limit CCVmin1 and the second closed circuit voltage lower limit CCVmin2 becoming less than the first voltage difference threshold A (refer to Step S33 in FIG. 6), while output limitation of the second battery B2 is being requested (refer to Step S21 in FIG. 5), and after the absolute value of the actual passing power Pwp becomes no more than the power threshold B, isolates the second battery B2 from the second power lines 31p, 31n (refer to Step S38 in FIG. 6). In addition, the management ECU 71, in the case of the output limit of the second battery B2 being released after having isolated the second battery B2 from the second power lines 31p, 31n by the above sequence (refer to Step S21 in FIG. 5), or a case of the voltage difference between the first closed circuit voltage lower limit CCVmin1 and the second closed circuit voltage lower limit CCVmin2 being at least the second voltage difference threshold C (refer to Step S63 in FIG. 9), connects the second battery B2 to the second power lines 31p, 31n (refer to Step S23 in FIG. 5 and Step S64 in FIG. 9).

According to the power supply system 1 related to the present embodiment, the following effects are exerted.

(1) The power supply system 1 connects the first power circuit 2 having the first battery B1, and the second power circuit 3 having the second battery B2 which has a use voltage range for the closed circuit voltage that overlaps the first battery B1 and a static voltage which is lower than the first battery B1 by the voltage converter 5, and connects the first power circuit 2 and the drive motor M by the power converter 43. The electronic control unit group 7 operates the power converter 43, voltage converter 5 and second power circuit 3, based on the requested drive power Pmot_d for the drive motor M. With such a power supply system 1, when the requested drive power Pmot_d increases in response to an acceleration request, for example, the electronic control unit group 7 operates the power converter 43 and/or voltage converter 5 so that the output power according to the requested drive power Pmot_d is supplied from the power circuit 43 to the drive motor M, and combines the power outputted from the first battery B1 and the power outputted from the second battery B2. Herein, in the case of wanting to suppress (including inhibit) discharge from the second battery B2 for any reason, the electronic control unit group 7 operates the voltage converter 5 and/or power converter 43 so that all or a majority of the requested drive power Pmot_d is covered by the power outputted from the first battery B1. However, when electrical current flowing in the first battery B1 increases, there are cases where the closed circuit voltage of the first battery B1 becomes lower than the static voltage of the second battery B2, and unintended power is outputted from the second battery B2. In contrast, with the present invention, in the case of the voltage difference between the first closed circuit voltage lower limit CCVmin1 of the first battery B1 and the second closed circuit voltage lower limit CCVmin2 of the second battery B2 becoming less than the first voltage difference threshold A while output limitation of the second battery B2 is being requested, the second battery B2 is isolated from the second power lines 31p, 31n of the second power circuit 3. Consequently, according to the power supply system 1, the second battery B2 is reliably detached from the second power line 31p, 31n, and thus the first power circuit 2; therefore, it is possible to reliably suppress unintended discharge from the second battery B2. In addition, according to the power supply system 1, since it is not necessary to suppress the output power of the first battery B1 as in the power supply system disclosed in Japanese Unexamined Patent Application, Publication No. 2020-162251 by the present applicant, it is possible to continuously supply the requested drive power Pmot_d to the drive motor M, while suppressing unintended discharge from the second battery B2.

(2) In the power supply system 1, in the case of the above-mentioned voltage difference becoming less than the first voltage difference threshold A while the output limitation of the second battery B2 is being requested, the electronic control unit group 7 operates the voltage converter 5 so that the absolute value of the actual passing power Pwp in the voltage converter 5 becomes no more than the power threshold B, and after the actual passing power Pwp becomes no more than the power threshold B, isolates the second battery B2 from the second power lines 31p, 31n. It is thereby possible to suppress the influence on vehicle behavior by isolating the second battery B2 from the second power lines 31p, 31n, in a state of the discharge electrical current or charging electrical current flowing to the second battery B2.

(3) The electronic control unit group 7 in the power supply system 1, in the case of the output limitation of the second battery B2 being released after isolating the second battery B2 from the second power lines 31p, 31n, or in the case of the voltage difference becoming at least the second voltage difference threshold C, connects the second battery B2 to the second power lines 31p, 31n. It is thereby possible to supply power from the second battery B2 to the first power circuit 2 promptly in the case of the necessity arising.

(4) In the power supply system 1, the management ECU 71 calculates the lower limits for closed circuit voltage of the first battery B1 and second battery B2 as the first closed circuit voltage lower limit CCVmin1 and the second closed circuit voltage lower limit CCVmin2. It is thereby possible to isolate the second battery B2 from the second power lines 31p, 31n at the appropriate timing, so as to reliably suppress unintended discharge from the second battery B2.

Although an embodiment of the present invention has been explained above, the present invention is not limited thereto. The configurations of detailed parts may be modified as appropriate within the scope of the gist of the present invention.

EXPLANATION OF REFERENCE NUMERALS

V vehicle
M drive motor (rotary electrical machine)
P pedals (requested power acquisition unit)
1 power supply system
2 first power circuit
21p, 21n first power line
22p, 22n first contactor
B1 first battery (first electrical storage device)

3 second power circuit (second power circuit)
31*p*, 31*n* second power line
32*p*, 32*n* second contactor
33 current sensor
B2 second battery (second electrical storage device)
43 power converter
5 voltage converter
7 electronic control unit group (power control unit, first voltage acquisition unit, second voltage acquisition unit)
71 management ECU (requested power acquisition unit)
72 motor ECU
73 converter ECU
74 first battery ECU
75 second battery ECU
81 first battery sensor unit (first voltage acquisition unit)
82 second battery sensor unit (second voltage acquisition unit)

What is claimed is:

1. A power supply system comprising:
a first power circuit having a first electrical storage device and a first power line to which the first electrical storage device is connected;
a second power circuit having a second electrical storage device having a use voltage range relative to closed circuit voltage which overlaps the first electrical storage device, and a static voltage which is lower than the first electrical storage device, and a second power line to which the second electrical storage device is connected;
a voltage converter which converts voltage between the first power line and the second power line;
a power converter which converts power between the first power line and a rotary electrical machine;
a first voltage acquisition unit which acquires a first voltage of the first electrical storage device;
a second voltage acquisition unit which acquires a second voltage of the second electrical storage device;
a requested power acquisition unit which acquires a requested power for the rotary electrical machine; and
a power control unit which operates the power converter, the voltage converter and the second power circuit based on the requested power,
wherein the power control unit isolates the second electrical storage device from the second power line, in a case of a voltage difference between the first voltage and the second voltage becoming less than a first voltage difference threshold, while an output limit of the second electrical storage device is being requested, and wherein the output limit is requested when there is concern over degradation in the second electrical storage device.

2. The power supply system according to claim 1, wherein the power control unit operates the voltage converter so that an absolute value of input/output power of the second electrical storage device becomes no more than a power threshold, in a case of the voltage difference becoming less than the first voltage difference threshold, while the output limit is being requested, and isolates the second electrical storage device from the second power line, after the input/output power of the second electrical storage device becomes no more than the power threshold.

3. The power supply system according to claim 1, wherein the power control unit connects the second electrical storage device to the second power line, in a case of the output limit being released after isolating the second electrical storage device from the second power line, or a case of the voltage difference becoming at least a second voltage difference threshold.

4. The power supply system according to claim 2, wherein the power control unit connects the second electrical storage device to the second power line, in a case of the output limit being released after isolating the second electrical storage device from the second power line, or a case of the voltage difference becoming at least a second voltage difference threshold.

5. The power supply system according to claim 1, wherein the first voltage acquisition unit and the second voltage acquisition unit respectively acquire lower limits for closed circuit voltages of the first electrical storage device and the second electrical storage device as the first voltage and the second voltage.

6. The power supply system according to claim 2, wherein the first voltage acquisition unit and the second voltage acquisition unit respectively acquire lower limits for closed circuit voltages of the first electrical storage device and the second electrical storage device as the first voltage and the second voltage.

7. The power supply system according to claim 3, wherein the first voltage acquisition unit and the second voltage acquisition unit respectively acquire lower limits for closed circuit voltages of the first electrical storage device and the second electrical storage device as the first voltage and the second voltage.

8. The power supply system according to claim 4, wherein the first voltage acquisition unit and the second voltage acquisition unit respectively acquire lower limits for closed circuit voltages of the first electrical storage device and the second electrical storage device as the first voltage and the second voltage.

* * * * *